United States Patent
Takeda

[19]

[11] Patent Number: 6,014,318
[45] Date of Patent: Jan. 11, 2000

[54] RESIN-SEALED TYPE BALL GRID ARRAY IC PACKAGE AND MANUFACTURING METHOD THEREOF

[75] Inventor: Shinji Takeda, Tokyo, Japan

[73] Assignee: NEC Corporation, Tokyo, Japan

[21] Appl. No.: 09/166,220

[22] Filed: Oct. 5, 1998

[30] Foreign Application Priority Data

Oct. 27, 1997 [JP] Japan ..................................... 9-293817

[51] Int. Cl.⁷ ................................................. H01L 23/043
[52] U.S. Cl. ........................... 361/764; 361/740; 361/761; 361/767; 361/768; 257/667; 257/787; 174/52.4; 174/255; 174/260; 438/115; 438/126; 438/127; 264/272.17
[58] Field of Search .................................... 361/761, 762, 361/764, 767, 768, 783, 792, 794, 748; 257/667, 700, 723, 730, 737, 738, 778, 787; 438/106, 115, 124, 126, 127; 264/272.11, 272.13, 272.14, 272.17; 174/52.2, 52.3, 52.4, 255, 260

[56] References Cited

U.S. PATENT DOCUMENTS

| | | | |
|---|---|---|---|
| 5,216,278 | 6/1993 | Lin et al. ................................. | 257/737 |
| 5,296,738 | 3/1994 | Freyman et al. ......................... | 257/730 |
| 5,468,999 | 11/1995 | Lin et al. ................................. | 257/700 |
| 5,490,324 | 2/1996 | Newman ................................. | 29/830 |
| 5,612,576 | 3/1997 | Wilson et al. ............................ | 257/787 |
| 5,721,450 | 2/1998 | Miles ..................................... | 257/667 |
| 5,729,050 | 3/1998 | Kim ....................................... | 257/667 |
| 5,767,446 | 6/1998 | Ha et al. ................................. | 174/260 |
| 5,773,895 | 6/1998 | Hassan et al. .......................... | 257/778 |
| 5,893,724 | 4/1999 | Chakravorty et al. ................... | 438/126 |
| 5,917,234 | 6/1999 | Tsuruzono .............................. | 257/667 |

FOREIGN PATENT DOCUMENTS

| | | |
|---|---|---|
| 62-244141 | 10/1987 | Japan . |
| 2-22886 | 1/1990 | Japan . |
| 4-65463 | 6/1992 | Japan . |
| 7-86335 | 3/1995 | Japan . |

*Primary Examiner*—Leo P. Picard
*Assistant Examiner*—John B. Vigushin
*Attorney, Agent, or Firm*—McGinn & Gibb,P.C.

[57] ABSTRACT

An IC package suitable for high density mounting and high speed is provided, by improving the humidity resistance and mounting stress resistance at a resin-sealed type BGA package and improving the reliability lessened a warp of the package. A concave part is provided in a multi-layer wiring substrate which has an exhaling route of water vapor expanded by heat in the inside of the package and a semiconductor chip is mounted at the concave part and is connected electrically to the substrate and the upper surface and sides of the package is sealed with resin. By this constitution, the infiltration of water is prevented and the stress at receiving thermal stress is lessened and the occurrence of stripping and crack of the inside of the package is prevented. Moreover, by utilizing the concave part effectively and connecting electrically, the wiring length is shortened and the high frequency characteristic is improved.

9 Claims, 11 Drawing Sheets

RESIN-SEALED TYPE BALL GRID ARRAY IC PACKAGE AND MANUFACTURING METHOD THEREOF

BACKGROUND OF THE INVENTION

The present invention relates to a resin-sealed type ball grid array IC package and a manufacturing method thereof, in which an integrated circuit IC is mounted on a wiring substrate having ball electrode terminals for connection.

DESCRIPTION OF THE RELATED ART

At a semiconductor package mounting such as an integrated circuit shown in FIG. 1, after the conventional insert mounting type package, a surface mounting type package being capable of a higher density mounting on a substrate has been developed. However, at a surface mounting type package disposing electrode lead wires on the side of this package, a mounting technology on a substrate for narrow pitch has nearly been limits of technology and has been getting impossible for an application of multi-pins.

Therefore, compared with the conventional surface mounting type, a resin-sealed type ball grid array package (hereinafter referred to as BGA package) which has advantages for miniaturization and multi-pins by electrode disposition of area array and for improvement of a high frequency characteristic by shortening a wiring route inside of a package and is possible to be manufactured in almost the same cost of the conventional surface mounting has been adopted.

FIG. 1 shows typical structure of the conventional resin-sealed type BGA. At the conventional technology, a semiconductor chip 102 is mounted via die a bonding material 104 on a multi-layer wiring substrate 101 constituting of a kind of epoxy resin material painted a solder resist 105 and the structure is that sealing resin 103 is only molded on the upper surface of the substrate including the semiconductor chip. This conventional structure especially has defects at humidity resistance, mounting heat resistance and coplanarity.

To lessen these defects, the Japanese Patent Laid-Open Publication No. SHO 62-244141 discloses the pin grid array package structure which mounts a semiconductor chip on a wiring substrate, and covers the upper surface and side of the wiring substrate with a sealing resin layer and makes humidity resistance higher, and the Japanese Utility Model Laid-Open Publication No. HEI 4-65463 discloses the module type LED structure which an LED chip is mounted on a wiring substrate providing a concave part for optical reflection, and covers the side or the part to the back with transparent resin and prevents resin stripping and water entering.

As a package suitable for multi-pins and high density mounting, the Japanese Patent Laid-Open Publication No. HEI 7-86335 and No. HEI 2-22886 disclose the package structure with solder bumps which a semiconductor chip is mounted on the wiring substrate and the upper surface and side of the wiring substrate are molded with resin.

At the above mentioned conventional resin-sealed type BGA package structure, the structure is that the upper part of the wiring substrate mounted a semiconductor chip is only sealed with resin, therefore the adherence strength at the boundary face between a solder resist layer of the surface of the wiring layer and the sealing resin is weak, water infiltration from this part induces corrosion and stripping of the inside of the package and causes the deterioration of the humidity resistance of the whole package.

Moreover, by the difference of the thermal expansion coefficient, thermal time elasticity coefficient and water absorption modulus, at the time getting the thermal stress in mounting, the boundary face among resin, chip and wiring substrate is the laminated structure of two-dimensional plane, therefore the stripping and crack at this part is liable to be caused. At the time of the vapor-phase expansion by the mounting heat of the water infiltrated into the inside of the package, the route of exhaling is not provided, a problem is liable to occur. The occurrence of these stripping and crack induces high resistance or braking of wire of the die bonding material and the wiring material of the substrate at the inside of the package, and bad performance and bad electric insulation of LSI is capable to be caused.

Moreover, the conventional structure has big occurrence of a warp caused by the line expansion coefficient between the sealing resin and the wiring substrate. The occurrence of these warps causes bad contact between the solder bump and the outside wiring substrate.

The technologies mentioned in the Japanese Patent Laid-Open Publication No. SHO 62-244141 (FIG. 2), the Japanese Patent Laid-Open Publication No. HEI 7-86335 (FIG. 3) and the Japanese Patent Laid-Open Publication No. HEI 2-22886 (FIG. 4) all have the structure resin molded the upper surface and side of the two-dimensional plane substrate and simply laminated the materials which have the different thermal expansion coefficient. Therefore, the structure hardly has an action which relaxes the stress occurring stripping and crack at the time of mounting thermal stress and is not enough to relax a warp of the package. And the technology of the Japanese Utility Model Laid-Open Publication No. HEI 4-65463 (FIG. 5) has the structure which is not suitable for the high density mounting and the application for multi-pins and only has the part that resin comes around and is not enough to prevent the stripping by the mounting heat. Moreover, the technologies of the Japanese Patent Laid-Open Publication No. SHO 62-244141 (FIG. 2) and the Japanese Utility Model Laid-Open Publication No. HEI 4-65463 (FIG. 5) are not the BGA structure and do not have advantages of the electric characteristics.

SUMMARY OF THE INVENTION

It is therefore an object of the present invention to provide an integrated circuit package which is further miniaturized, high speeded and suitable for high density mounting, by correcting defects in reliability of the conventional technology having problems in humidity resistance and mounting heat resistance and by improving the reliability of the connecting part to the outside wiring substrate with relaxation of a warp of the package.

To solve the above mentioned problems, the present invention provides a ball electrode connecting electrically to an outside wiring on the bottom face of a substrate, a multi-layer wiring substrate having a concave part on the opposite main surface of said bottom face of said substrate, a semiconductor chip fixed in mounting at said concave part of said multi-layer wiring substrate by a fixing material, a connecting means for connecting electrically said multi-layer wiring substrate to said semiconductor chip and a sealing means for sealing with resin the upper surface including said semiconductor chip and the sides of said wiring substrate.

The method to solve the above mentioned problems, the present invention provides a ball electrode connecting electrically to an outside wiring on the bottom face of a substrate, a process for providing a concave part with the depth of at least one depth of layer in a multi-layer wiring substrate, a process mounting a semiconductor chip on said concave part of said multi-layer wiring substrate with a fixing material, a process connecting electrically said multi-layer wiring substrate and said semiconductor chip and a process sealing with resin the upper surface including said semiconductor chip which is connected and mounted on said wiring substrate and the sides of the wiring substrate.

Preferably, a resin-sealed type BGA package of the present invention provides a ball electrode on the bottom face, a route exhaling vapor and water in the inside of the package and mounts the semiconductor chip at the concave part of the wiring substrate having the concave part and connects electrically the wiring substrate and the semiconductor chip and seals with resin the upper surface including said semiconductor chip and sides of the wiring substrate. With this structure, the above mentioned object is achieved.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

The present invention provides a multi-layer wiring substrate having a concave part with the depth of at least one layer depth of the multi-layer wiring substrate and with an area more than an area of a semiconductor chip and on this concave part the semiconductor chip is mounted, and the electrical connecting part between the semiconductor chip and the multi-layer wiring substrate is not limited to the top layer of this wiring substrate. This is a first point of the present invention.

A second point of the present invention is that the multi-layer wiring substrate provides at least one vapor hole as a route exhaling water expanded by vapor-phase expansion by mounting heat inside the package.

A third point of the present invention is that in addition to the upper surface of the wiring substrate mounted the semiconductor chip, the sides are also molded with resin.

A resin-sealed type BGA package of the present invention has the above mentioned characteristics, therefore compared with the conventional package, first, at the present invention a boundary face between a solder resist layer on the surface of the wiring substrate and sealing resin at a resin-sealed type BGA package is not exposed to the outside and the infiltration of water from said boundary face is prevented completely.

Second, compared with the conventional resin-sealed type BGA package, the infiltration route of water along the wiring substrate is complicated and moreover at the fracture plane of the sides of the concave part and the surroundings of the wiring substrate, the adhesion strength between the wiring substrate and the sealing resin is improved, therefore the infiltration of water to the inside of the package is lessened. And the sealing resin is easily formed by the conventional technology and by a transfer molding process with some pressure, therefore the molded resin strength is strong enough.

Third, on account of the structure is that each boundary face of the sealing resin, the semiconductor chip and the wiring substrate is disposed in three dimension and the exhaling route of expanded water vapor is provided, the tensile stress, the plane stress and shearing stress at the time of receiving a thermal stress are lessened and at the same time the transmission of a stress component is blocked, therefore the occurrence of the stripping and crack is prevented. With the same reason, the warp of the package by the line expansion coefficient is lessened.

Figure 1:
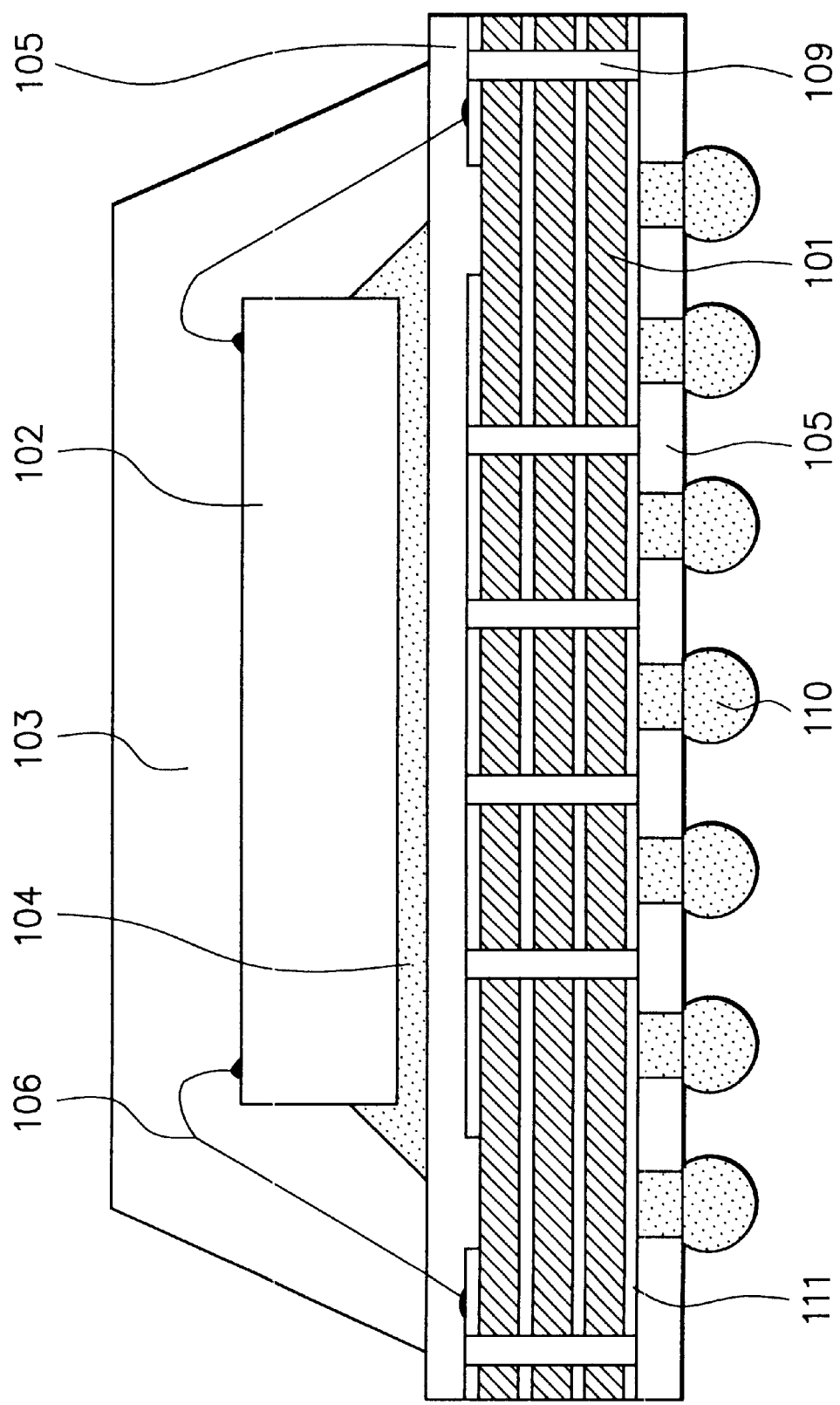
FIG. 1 is a sectional side view of a resin-sealed type BGA package of the conventional package.
Figure 2:
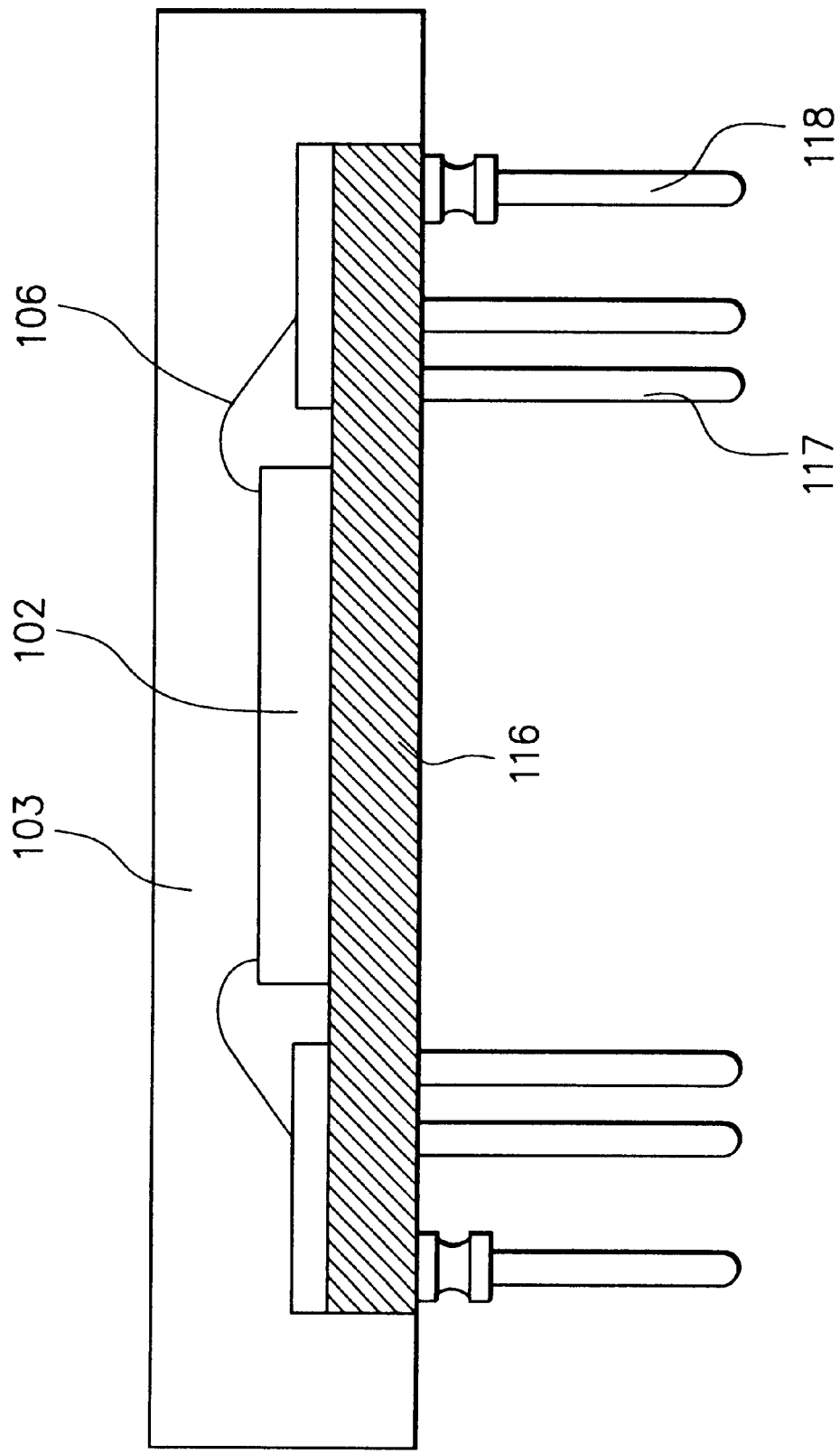
FIG. 2 is a sectional side view of an example of the Japanese Patent Laid-Open Publication No. SHO 62-244141.
Figure 3:
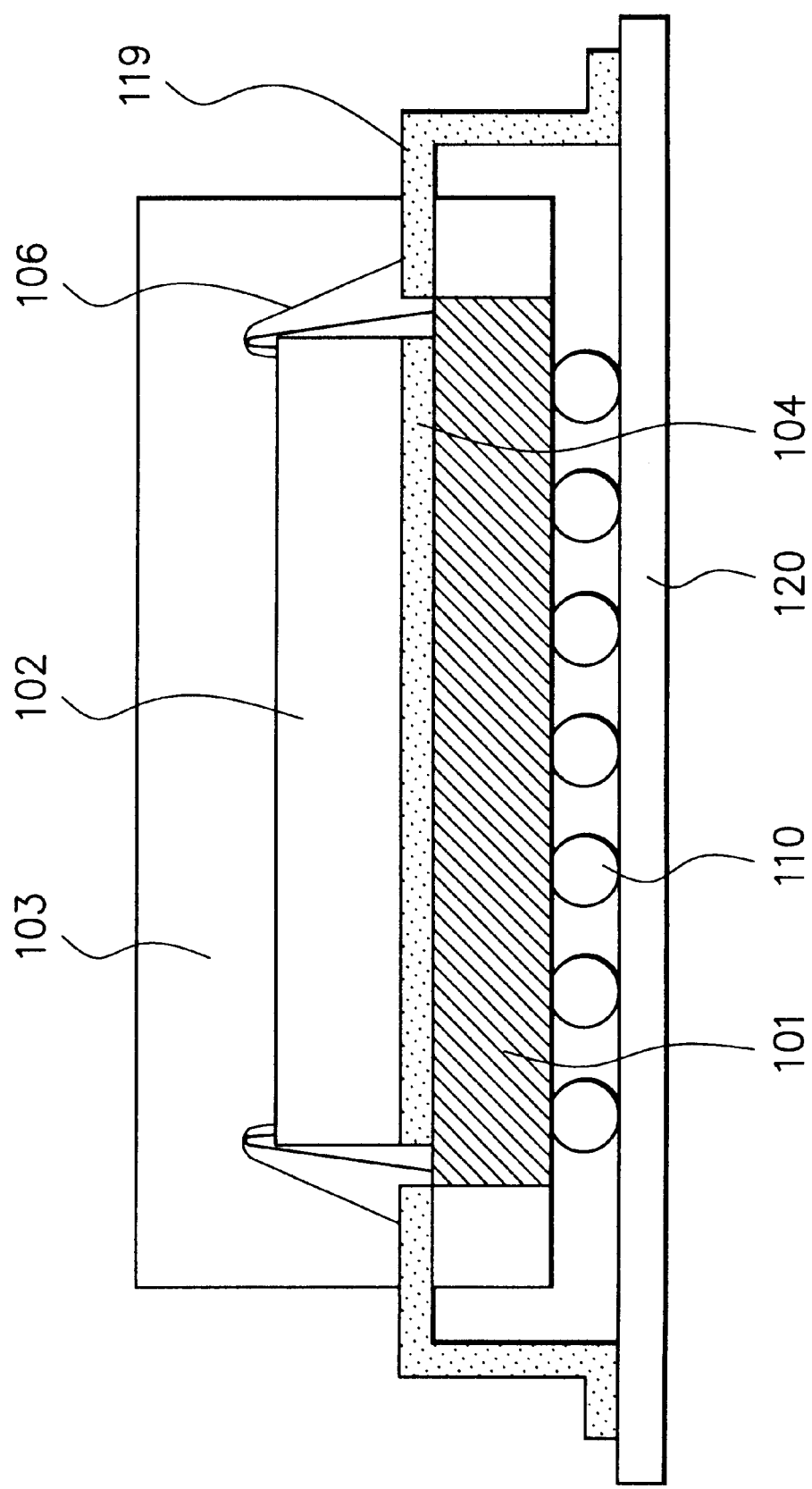
FIG. 3 is a sectional side view of an example of the Japanese Patent Laid-Open Publication No. HEI 7-86335.
Figure 4:
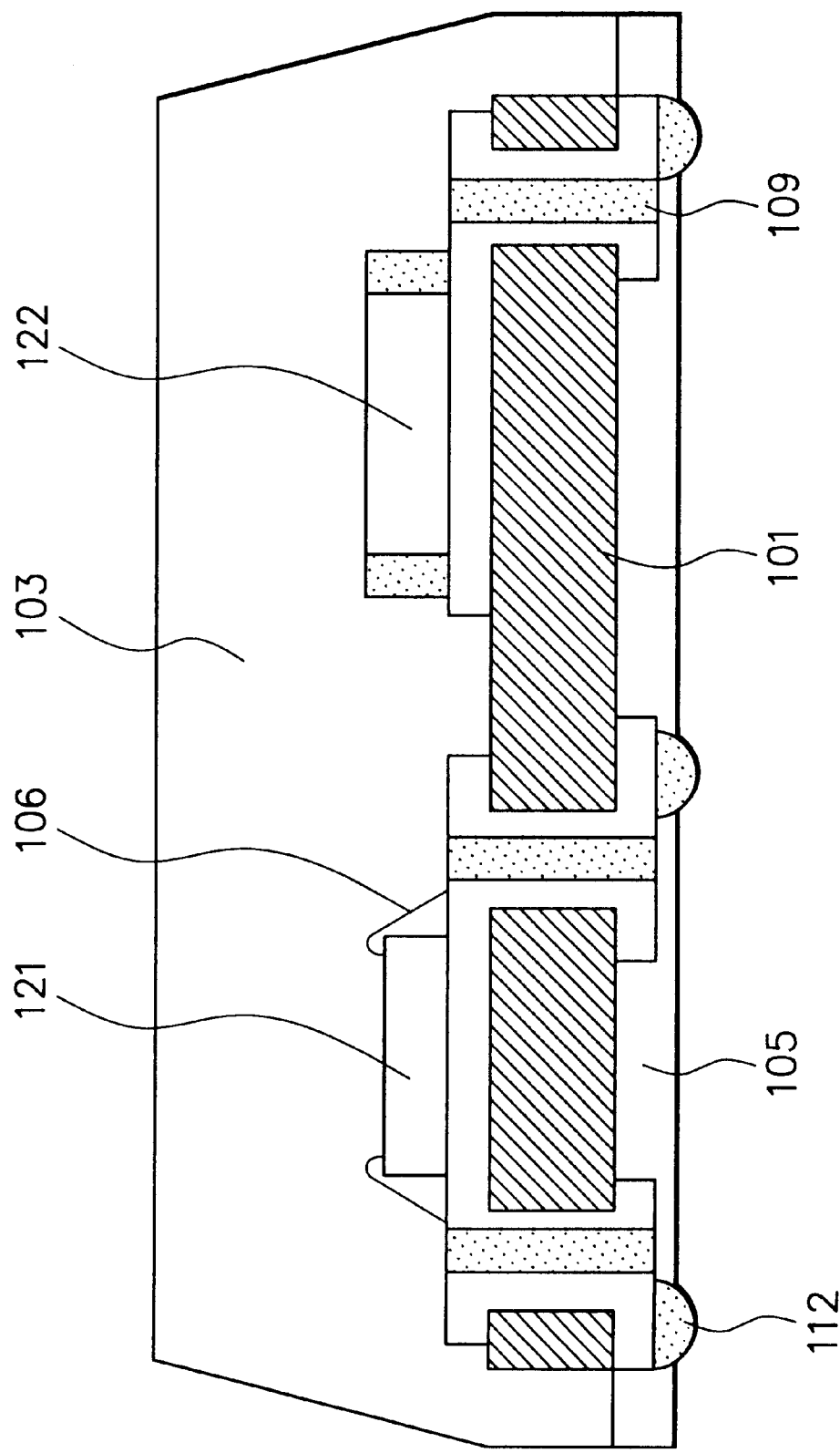
FIG. 4 is a sectional side view of an example of the Japanese Patent Laid-Open Publication No. HEI 2-22886.
Figure 5:
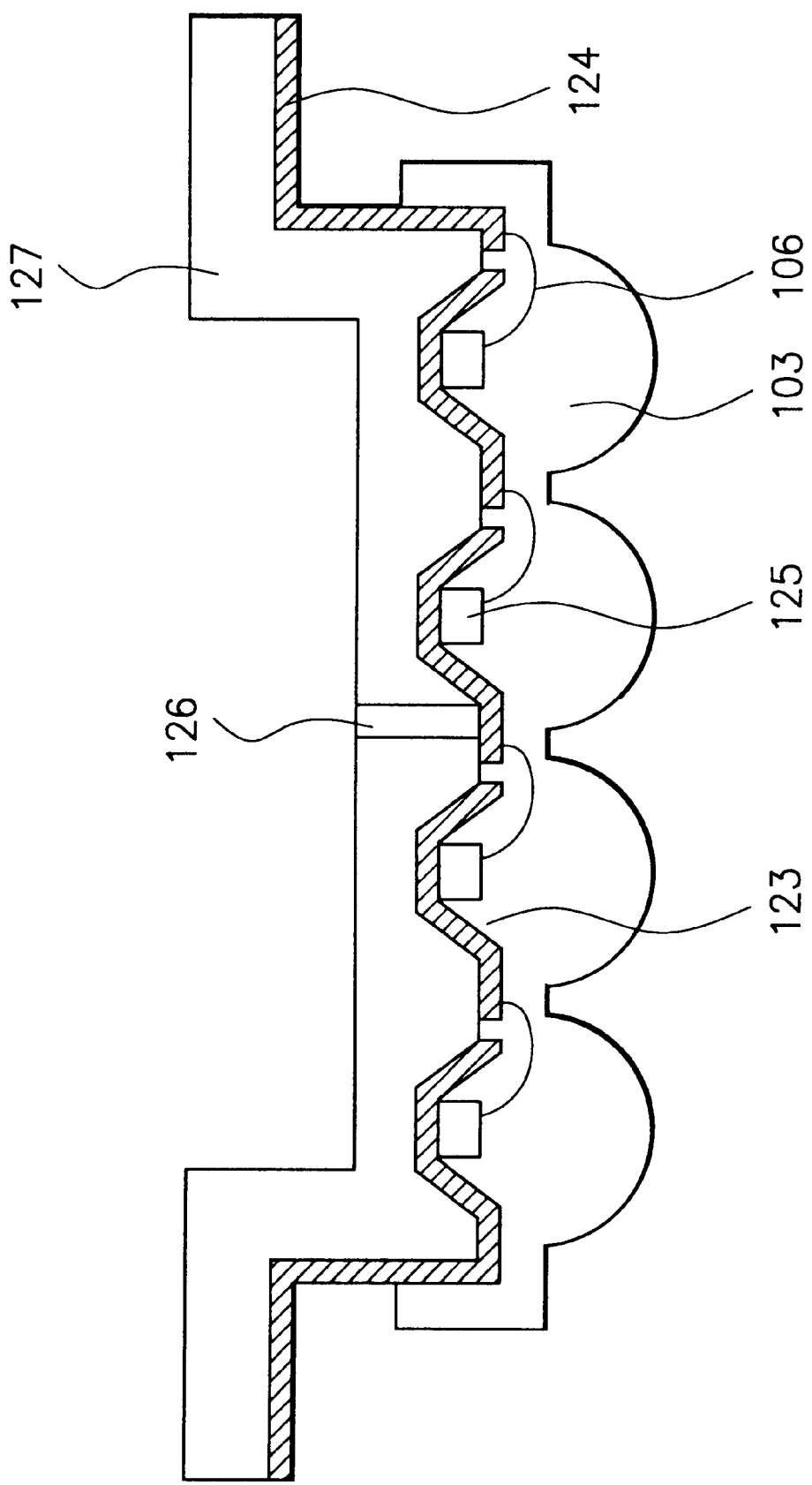
FIG. 5 is a sectional side view of an example of the Japanese Utility Model Laid-Open Publication No. HEI 4-65463.
Figure 6:
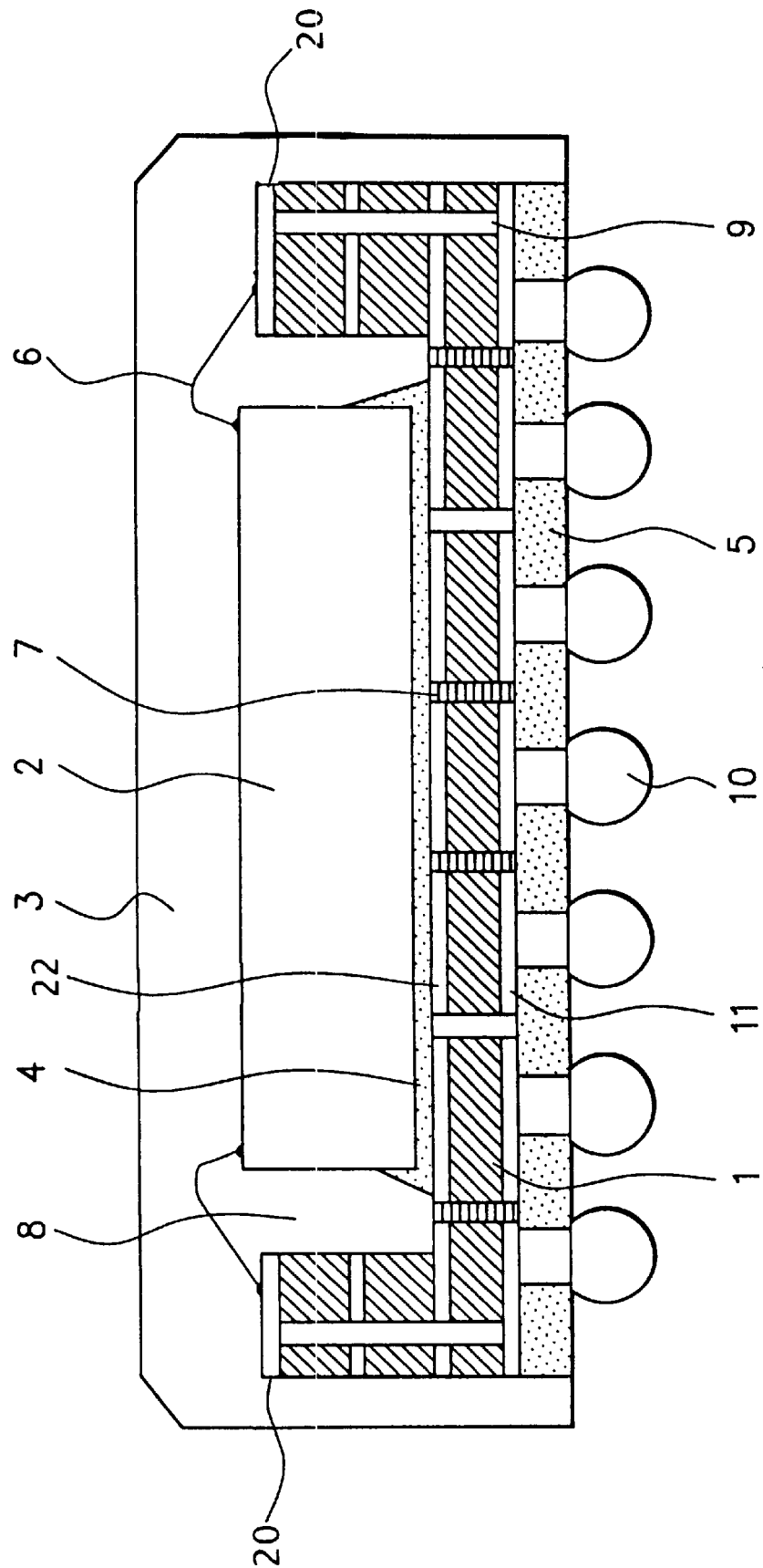
FIG. 6 is a sectional side view of a typical example of an embodiment of the present invention.
Figure 7:
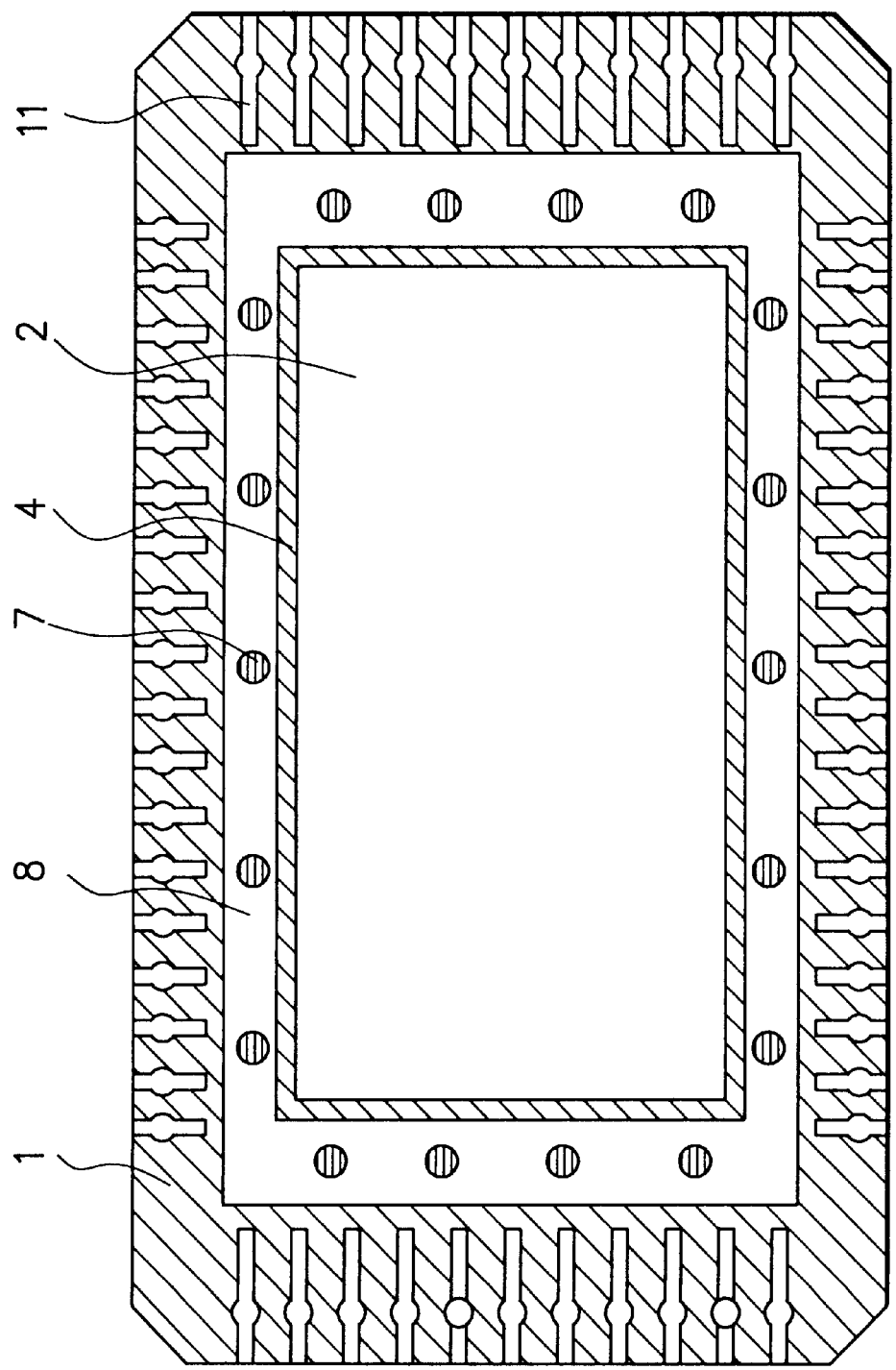
FIG. 7 is an upper surface view at a state which is not sealed with resin and not connected by wire bonding to a semiconductor chip at the typical example of the embodiment of the present invention.

Referring now to the drawings, embodiments of the present invention are explained in detail. FIG. 6 is a sectional side view of a typical example of an embodiment of the present invention. FIG. 7 is an upper surface view at a state which is not sealed with resin and not connected by wire bonding to a semiconductor chip at the typical example of the embodiment of the present invention. A BGA package of the present invention provides a ball electrode connecting electrically to an outside wiring on the bottom of the substrate, a multi-layer wiring substrate having a concave part on the opposite main surface of said bottom of said substrate, a semiconductor chip fixed in mounting at said concave part of said multi-layer wiring substrate by a fixing material, a connecting means for connecting electrically said multi-layer wiring substrate to said semiconductor chip and seals with resin the upper surface including said semiconductor chip and sides of the wiring substrate.

Referring to FIGS. 6 and 7, the structure of the present invention is explained. The resin-sealed type BGA package of the present invention provides a vapor hole 7 and a concave part 8 which act as an exhaling route of expanded water vapor, a ball electrode terminal 10 connecting electrically to an outside wiring substrate on the bottom face, a wiring substrate 1 formed power supply or signal wiring 11 with a conductive material, a semiconductor chip 2, sealing resin 3, a die bonding material 4 for mounting the semiconductor chip on the wiring substrate and a metal wire 6 for connecting the semiconductor chip to the wiring substrate.

The wiring substrate 1 is a multi-layer substrate with three to fifteen layers and is constituted of a conductive wiring material such as copper Cu or gold Au and a polyimide film or a glass epoxy type resin material insulating electrically among layers and a solder resist 5 as a protection film is painted on the bottom face. Preferably, in case of the concave part is formed in a state of steps, terminals on the semiconductor chip are able to be connected only to a special layer by bonding.

Preferably, the center part of the wiring substrate is laminated to provide a concave part which depth is more than one layer and the vapor hole 7 which is an exhaling hole of expanded water vapor is disposed on at least more than one place at the surroundings of the concave part. The concave part 8 is defined by side portions 20 and a planar portion 22 as shown in FIG. 6. The vapor holes 7 of the present invention are disposed along the planar portion 22 in areas close to the side portions 20. That is, as shown in FIG. 7, the vapor holes 7 are disposed in a perimeter area of the planar portion 22.

At the bottom face of the wiring substrate 1, the ball electrode terminal 10 connecting electrically to the outside wiring substrate is disposed, the semiconductor chip 2, by this ball electrode terminal 10, is connected to the outside wiring via wiring including through hole 9 for an electrical signal in the wiring substrate 1. The material of this ball electrode terminal 10 is usually solder. The semiconductor chip 2 is bonded to the concave part of the wiring substrate 1 via the die bonding material 4. As a die bonding material, both conductive bond and non-conductive bond are usable, however at the using of conductive bond, the bottom face of the concave part which is the bonding face is desirable to be a ground surface.

An electrode terminal of the semiconductor chip is connected to the wiring substrate by the metal wire 6, as the material of the metal wire 6, gold Au or aluminum Al is desirable. At the embodiment of the present invention, after the semiconductor chip 2 is mounted on the wiring substrate 1 in the above mentioned process, the semiconductor chip is fixed on a lower die 13 shown in FIG. 8 and covered with an upper die 14 having a resin injection gate 15. After this process, sealing resin is injected from the resin injection gate 15, the sealing resin layer 3 is formed by transfer molding and plural resin-sealed type BGA packages are able to be formed at the same time.

Figure 9:
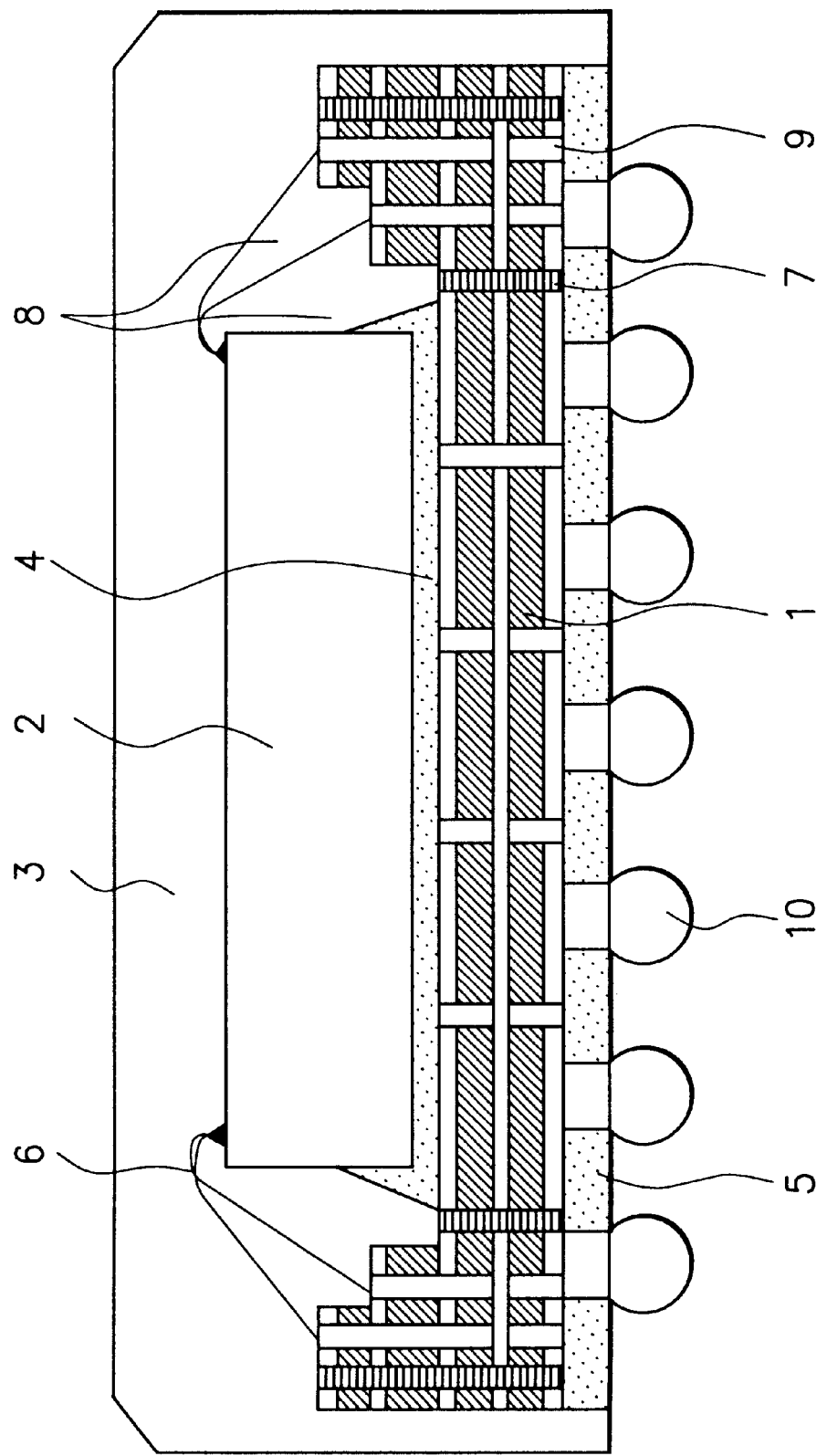
FIG. 9 is a sectional side view of a first example of the embodiment of the present invention.
Figure 10:
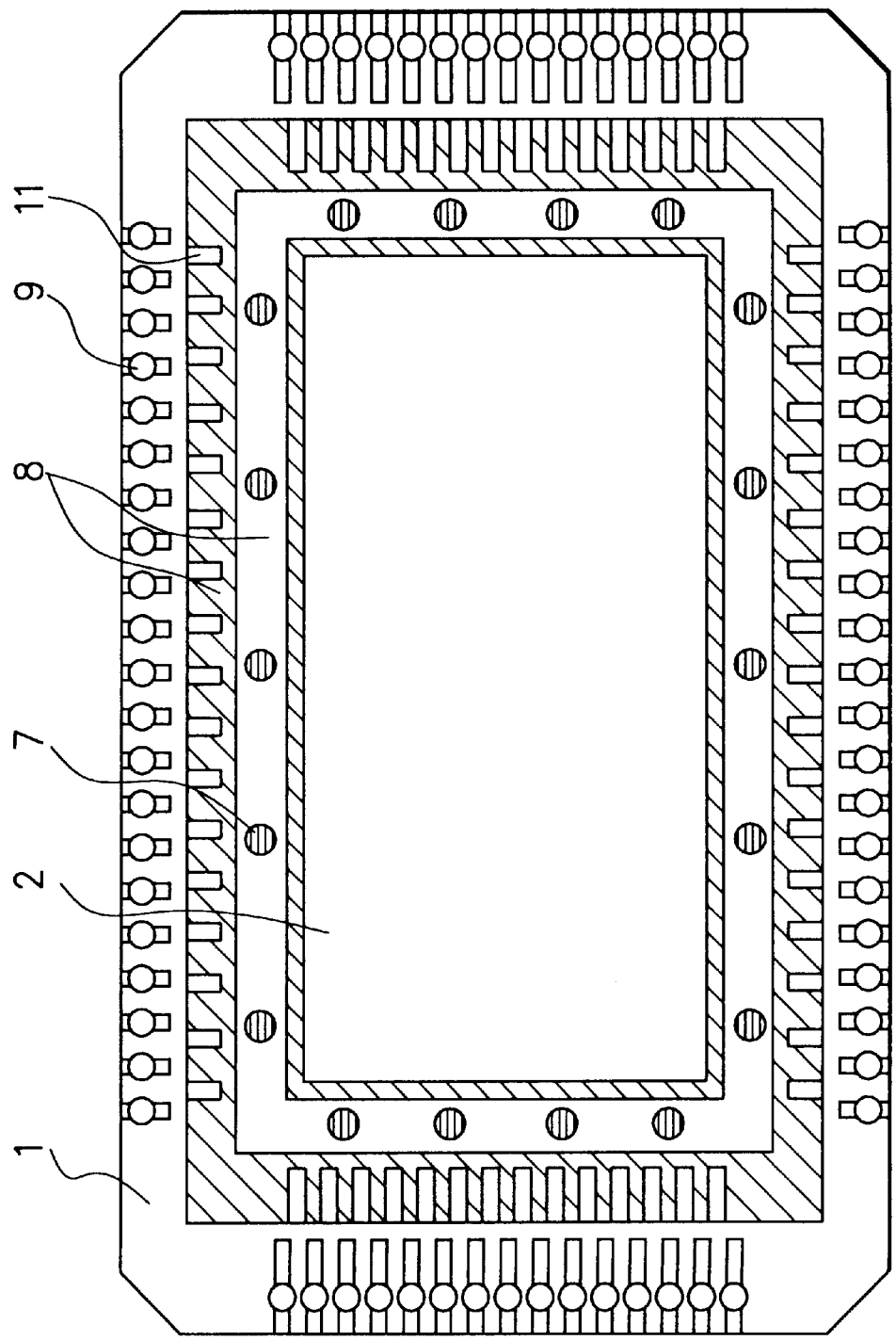
FIG. 10 is an upper surface view at a state which is not sealed with resin and not connected by wire bonding to a semiconductor chip at the first example of the embodiment of the present invention.

FIG. 9 is a sectional side view of a first example of the embodiment of the present invention and FIG. 10 is an upper surface view at a state which is not sealed with resin and not connected by wire bonding to a semiconductor chip at the first example of the embodiment of the present invention. In FIGS. 9 and 10, the wiring substrate 1 is a multi-layer substrate of five layers and Cu copper foil with about 15 μm thickness plated Ni—Au nickel gold is used for the wiring material 11. And as a base material, glass fiber cloth and epoxy material are used and as an insulation protection film on the bottom face of the substrate solder resist 5 is painted. A first concave part is formed in between the first layer and the second layer from the upper part of the substrate and a second concave part having rather smaller area than the first concave part is formed between the second layer and the third layer and laminated.

On the bottom face of the wiring substrate 1, solder balls 10 are disposed, at the time of mounting of the package said parts are melted and solder bumps are formed and connected electrically to the outside wiring substrate. A diameter of this solder ball is about 600 μm and solder balls are disposed in a pitch of about 1 mm. A process mounting solder balls on the bottom face of the wiring substrate 1 is that the solder balls formed in advance are adsorbed to the wiring substrate 1 and mounted by a reflow process, this kind of process is adopted.

As shown in FIGS. 6–10, vapor holes 7 which are exhaling routes of expanded water vapor along each side are exposed vertically from the boundary face of sealing resin at the wiring substrate 1. The inside of this vapor hole is filled with epoxy resin or the same material of solder resist and an effective quantity of vapor holes is different in the size of a semiconductor chip or water absorption modulus of sealing resin and a wiring substrate and so on.

The semiconductor chip 2 is bonded on the third layer which is the bottom face of concave part of the wiring substrate with silver paste as die bonding material 4 and is connected to the first layer and the second layer of the wiring substrate with wire bonding using gold Au as material. As this, by the wire bonding connection is possible to be connected freely to the first layer or the second layer, the layout of the signal wiring is easy to be optimized.

Figure 8:
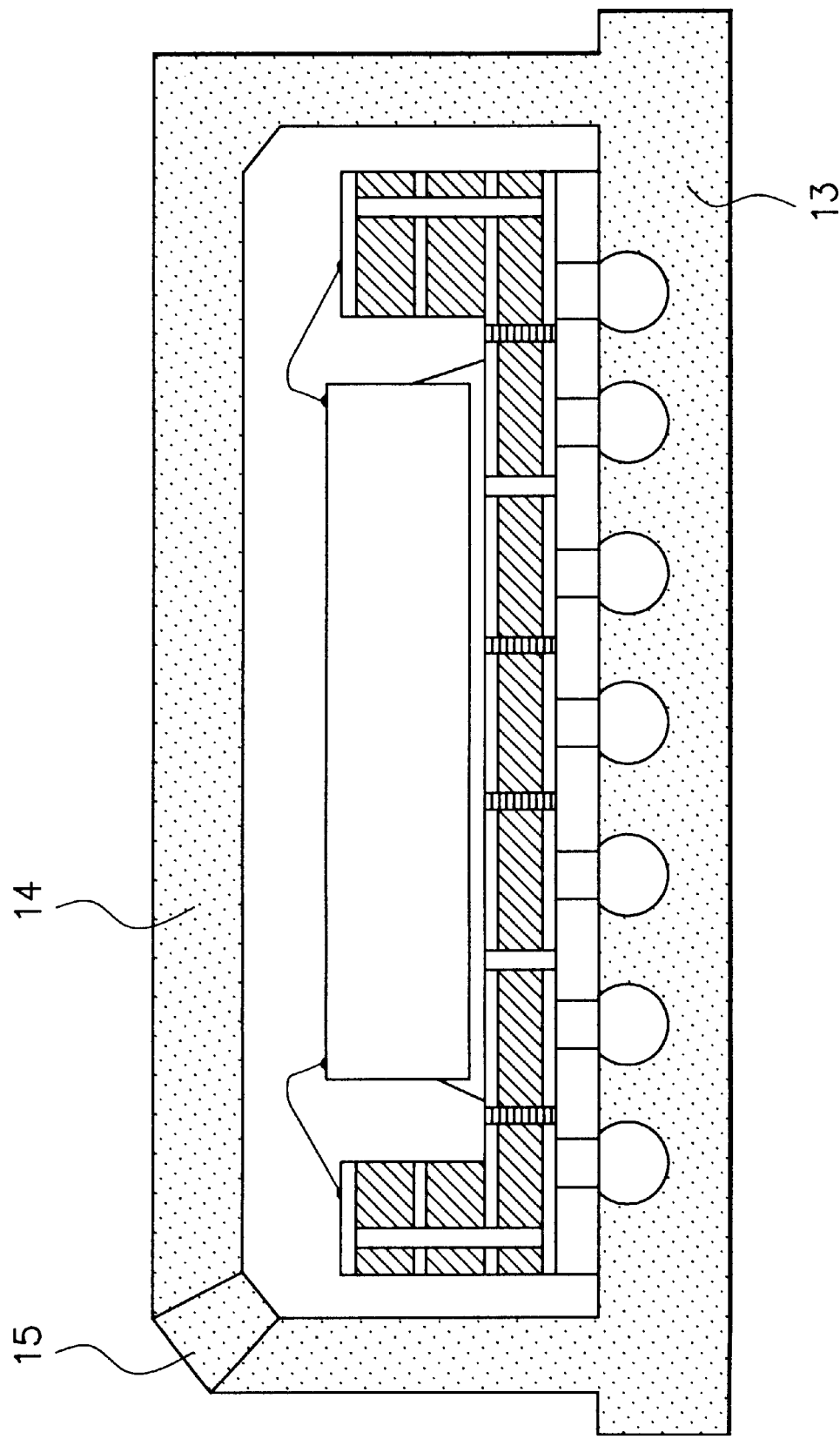
FIG. 8 is a sectional side view of a die for manufacturing the typical example of the embodiment of the present invention.
Figure 11:
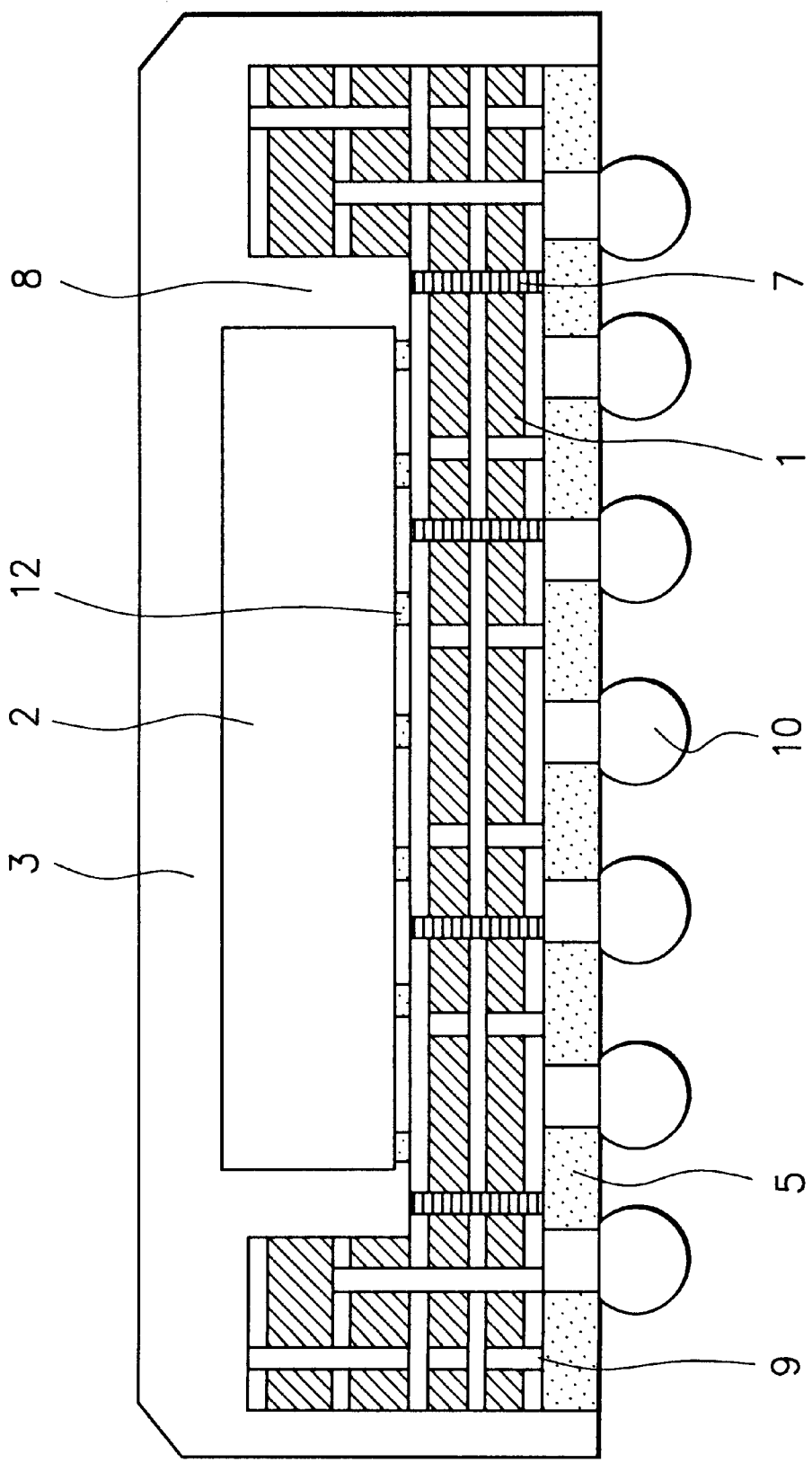
FIG. 11 is a sectional side view of a second example of the embodiment of the present invention.

By the process shown in FIG. 8, the sealing resin 3 is formed by transfer molding covering the upper part and the sides of the wiring substrate which is mounted the semiconductor chip. FIG. 11 is a sectional side view of a second example of the embodiment of the present invention. At FIG. 11, the wiring substrate 1 is like the same as the first example of the embodiment of the present invention, the wiring substrate 1 is a multi-layer wiring substrate having concave part disposing solder balls on the bottom face for connecting to the outside, however for the connection between the semiconductor chip 2 and the wiring substrate, a metal wire is not used, a bump 12 using solder or gold Au or conductive resin is formed and the wiring substrate 1 is connected to electrodes of the semiconductor chip and the semiconductor chip 2 is mounted without using die bonding material. In this case, the sealing resin 3 is formed in covering the upper part and the sides of the wiring substrate like as the first example of the embodiment of the present invention, the sealing resin 3 enters to the boundary face between the semiconductor chip 2 and the wiring substrate 1 and seals. At this example, it is desirable that the first layer and the second layer from the upper part of the wiring substrate are ground or power supply and the others are signal wiring surfaces.

According to the method mounting and connecting the semiconductor chip directly to the wiring substrate by forming bump like as the example stated above, the shortening of the wiring length of wiring metal and the reduction of added capacitance and inductance are performed, moreover the electrodes on the semiconductor chip are possible to be disposed at not only the surrounding part but also the center part of chip and the degree of freedom for disposition is increased, the constitution suitable for higher speed and miniaturization is realized. And it is possible to dispose a heat sink on the upper part of the package i.e. the back of the chip.

As explained above, the present invention covers the upper surface and sides of the wiring substrate with sealing resin and the adhesion strength between the wiring substrate at the fracture plane of the concave part/the sides of the wiring substrate and the sealing resin is strong and the water infiltrating route is three dimension, therefore it is possible to decrease largely the water infiltrating from the boundary face of the wiring substrate and the sealing resin and the large improvement of the humidity resistance is attained.

The wiring substrate has the concave part, the resin and the semiconductor chip and the wiring substrate which are different in a thermal expansion coefficient and thermal time coefficient of elasticity and water absorption modulus are disposed in three dimension and the stress is lessened at receiving the mounting heat stress. Moreover, the wiring substrate provides an exhaling route of expanded water vapor and the mounting heat resistance is improved and prevents the occurrence of stripping and crack inside of the package and then the reliability after mounting is improved. Additionally the warp of the package is lessened by having the concave part and the reliability of the connection to the outside wiring is improved.

Moreover, it is possible to connect the semiconductor chip with the plural layers inside the wiring substrate. Therefore the degree of freedom of the layout of power supply line and signal lines inside of the substrate is increased and by shortening the wiring route inside the package and the reduction of noise, it is also possible to expect the improvement of the high frequency characteristics.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A ball grid array package, comprising:
    a ball electrode that connects to an outside wiring on a bottom face of a multi-layer wiring substrate;
    said multi-layer wiring substrate having a concave part on a surface opposite said bottom face, said concave part defined by side portions and a planar portion between said side portions;
    a semiconductor chip mounted at said planar portion using a fixing material, said planar portion including a first area defined as an area of the wiring substrate between said wiring substrate and said semiconductor chip and a second area defined as an area of said planar portion located on a perimeter of said first area; and
    a sealing material that seals an upper surface of said package including said semiconductor chip and sides of said wiring substrate, wherein a plurality of holes are provided in said wiring substrate and act as an exhaling route to exhale vapor at the time of vapor-phase expansion of water that has infiltrated into an inside of said package, said plurality of holes being provided at least in said second area of said planar portion of said concave part of said wiring substrate.

2. A ball grid array package in accordance with claim 1, wherein said semiconductor chip is connected electrically to wiring parts of different layers of said multi-layer wiring substrate.

3. A ball grid array package in accordance with claim 1, wherein said semiconductor chip and said wiring substrate are connected by a bump of solder or gold or conductive resin provided in the first area between the semiconductor chip and the wiring substrate.

4. A ball grid array package, comprising:
    a ball electrode connecting electrically to an outside wiring on a bottom face of a multi-layer wiring substrate;
    said multi-layer wiring substrate having a concave part a surface opposite said bottom face, said concave part defined by side portions and a planar portion between said side portions;
    a semiconductor chip fixed in mounting at said planar portion of said concave part of said multi-layer wiring substrate by a fixing material, said planar portion having a first area defined as an area between said wiring substrate and said semiconductor chip and a second area defined as an area of said planar portion located on a perimeter of said first area;
    connecting means for connecting electrically said multi-layer wiring substrate to said semiconductor chip;
    sealing means for sealing with resin an upper surface of said package including said semiconductor chip and sides of said wiring substrate; and
    a plurality of holes provided in said wiring substrate that act as an exhaling route to exhale vapor at the time of vapor-phase expansion of water that has infiltrated into an inside of said package, said plurality of holes being provided at least in said second area of said planar portion of said concave part of said wiring substrate.

5. A ball grid array package in accordance with claim 4, wherein:
    said semiconductor chip is connected electrically to wiring parts of different layers of said multi-layer wiring substrate.

6. A ball grid array package in accordance with claim 4, wherein:
    said semiconductor chip and said wiring substrate are connected by a bump of solder or gold or conductive resin being provided at least in the first area of the wiring substrate between the semiconductor chip and the wiring substrate.

7. A manufacturing method of a ball grid array package, comprising:
    connecting a ball electrode electrically to an outside wiring on a bottom face of a multi-layer wiring substrate;
    providing a concave part having a depth of at least one layer in said multi-layer wiring substrate, said concave part defined by side portions and a planar portion between said side portions;
    mounting a semiconductor chip on said concave part of said multi-layer wiring substrate with a fixing material, said planar portion having a first area defined as an area between said wiring substrate and said semiconductor chip and a second area defined as an area of said planar portion located on a perimeter of said first area;
    connecting electrically said multi-layer wiring substrate and said semiconductor chip; and
    sealing with resin an upper surface of said package including said semiconductor chip which is connected and mounted on said wiring substrate and sides of the wiring substrate, wherein a plurality of holes are provided in said wiring substrate that act as an exhaling route to exhale vapor at the time of vapor-phase expansion of water that has infiltrated into an inside of said package, said plurality of holes being provided in said second area of said planar portion of said concave part of said wiring substrate.

8. A manufacturing method of a ball grid array package in accordance with claim 7, wherein:
    said semiconductor chip is connected electrically to wiring parts of different layers of said multi-layer wiring substrate.

9. A manufacturing method of a ball grid array package in accordance with claim 7, wherein:

said semiconductor chip and said wiring substrate are connected by forming a bump of solder or gold or conductive resin provided in the first area of the wiring substrate between said semiconductor chip and said wiring substrate.

* * * * *